United States Patent [19]
Harvey

[11] Patent Number: 5,891,032
[45] Date of Patent: Apr. 6, 1999

[54] FAT FREE TOF ANGIOGRAPHY

[75] Inventor: Paul Royston Harvey, Karkur, Israel

[73] Assignee: Elscint Ltd, Haifa, Israel

[21] Appl. No.: 834,874

[22] Filed: Apr. 10, 1997

[51] Int. Cl.⁶ .................................................. A61B 5/055
[52] U.S. Cl. ........................ 600/419; 324/306; 324/307; 324/309
[58] Field of Search ................................... 600/419, 410; 324/306, 307, 309

[56] References Cited

U.S. PATENT DOCUMENTS

| | | |
|---|---|---|
| 4,698,591 | 10/1987 | Glover et al. . |
| 4,761,612 | 8/1988 | Holland et al. . |
| 4,814,708 | 3/1989 | Van Der Meulen et al. . |
| 4,845,613 | 7/1989 | Netter et al. . |
| 4,866,386 | 9/1989 | Sattin et al. . |
| 4,871,967 | 10/1989 | Rotem et al. . |
| 4,885,542 | 12/1989 | Yao et al. . |
| 4,893,081 | 1/1990 | Zur . |
| 4,970,457 | 11/1990 | Kaufman et al. . |
| 5,054,489 | 10/1991 | Axel et al. . |
| 5,068,786 | 11/1991 | Netter et al. . |
| 5,070,876 | 12/1991 | Wright ................................. 128/653.3 |
| 5,339,035 | 8/1994 | Schneider et al. ....................... 324/309 |
| 5,557,202 | 9/1996 | Miyazaki et al. ........................ 324/307 |
| 5,677,626 | 10/1997 | Miyazaki et al. ........................ 324/307 |

OTHER PUBLICATIONS

Thomasson et al., David M., "Minimum–Time Spatial Spectral Pulses Using a Phase Modulated 1–1Binomial Pulse Design", Proceedings of the Society of Magnetic Resonance Second Meeting, 120 (1994).

Thomasson et al., David M., "Optimized Water Excitation Using a Phase Modulated 1–2–1 Binomial Pulse Train", Proceedings of the Society of Magnetic Resonance Second Meeting, 797 (1994).

Thomasson et al., David M., "Phase–Modulated Binomial Spatial–Spectral Pulse Design for Spin–Echo Applications", Proceedings of the Society of Magnetic Resonance Third Meeting, 561 (1995).

Thomasson et al, David M., "Contrast Behavior of Phase Modulation Schemes Used in Minimum–Time Spatial–Spectral RF Pulses", Proceedings of the Society of Magnetic Resonance Fourth Meeting, 1462 (1996).

(List continued on next page.)

*Primary Examiner*—Marvin M. Lateef
*Assistant Examiner*—Eleni Mantis Mercader
*Attorney, Agent, or Firm*—Fenster & Co. Patent Attorneys, Ltd.

[57] ABSTRACT

A method for performing motion-compensated spectral-spatial selective magnetic resonance imaging. The method includes applying a radio frequency (RF) spectral-spatial excitation pulse sequence to a region of a body. The excitation sequence includes a binomial pulse train including at least two sub-pulses. The binomial pulse train also provides spectrally selective excitation of a selected resonance frequency at the predetermined field strength. The method also includes applying to the same body region an oscillating slice selection gradient so that each sub-pulse of the binomial pulse train is applied during portions of the oscillating gradient having the same polarity. The oscillating gradient further includes at least one extra gradient switch added to the end of the oscillating gradient for providing a balanced gradient for inherently motion-compensated slice selection. The method can be applied for performing motion-compensated spectral spatial selective magnetic resonance angiography by using a binomial pulse train having sub-pulse envelopes which are optimized for providing slice variable tip angle producing a spatially varying slice excitation profile for a predetermined range of blood flow velocities and slab widths and a predetermined magnetic field strength. The spatially varying slice excitation profile can be a non-linearly increasing slice excitation profile. The methods provides an improved dynamic range of the MRI images and improved small vessel visualization in angiography.

21 Claims, 12 Drawing Sheets

OTHER PUBLICATIONS

Harvey et al., Paul R., "The Modular Gradient–Coil—A New Concept In High Performance Whole Body Gradient Coil Design", International Society for Magnetic Resonance in Medicine (ISMRM), Fifth Scientific Meeting, Abstract (1997).

Hore, P.J., "Solvent Suppression in Fourier Transform Nuclear Magnetic Resonance", The Journal of Magnetic Resonance, vol. 15, pp. 283–300 (1983).

Meyer et al., Craig H., "Simultaneous Spatial and Specral Selective Excitation", Magnetic Resonance in Medicine, vol. 15, pp. 287–304 (1990).

Zur, Yuval, "Optimized Slab Profile for 3D–TOF Angiography", SMRM Abstracts, 960 (1994).

Harvey et al., Paul R., "Fat Free Angiography Using Flow Compensated Binomial–Spectral–Spatial–Slice– Variable–Tip–Angle RF Slice Selection", International Society for Magnetic Resonance in Medicine (ISMRM), Fifth Scientific Meeting, Abstract (1997).

Harvey, Paul R., "A Motion Compensated, Partial Fourier, Snapshot EPI Sequence For Cardiac Cine At 0.5T", International Society for Magnetic Resonance in Medicine (ISMRM), Fifth Scientific Meeting,Abstract (1997).

Ehman et al., Richard L., "Flow Artifact Reduction in MRI: A Review of the Roles of Gradient Moment Nulling and Spatial Presaturation", Magnetic Resonance in Medicine, vol. 14, pp. 293–307 (1990).

Forster et al., "Spectral–Spatial Excitation and Saturation in Multi–Slice Imaging", SMRM Abstracts, 1461 (1996).

FAT FREE TOF ANGIOGRAPHY

FIELD OF THE INVENTION

The present invention relates generally to the field of medical imaging and more particularly relates to the field of magnetic resonance imaging (MRI).

BACKGROUND OF THE INVENTION

A unique property of magnetic resonance imaging (MRI) is the ability to selectively image different chemical species by virtue of what is known as the chemical shift phenomenon. For example, in the human body the fat exhibits a resonance which is separated from the water resonance by approximately 3.5 ppm. At a field strength of 2 Tesla this equates to a frequency separation of about 280 Hz in the NMR spectrum. Silicon exhibits a chemical shift of approximately 5 ppm.

It is common that a "water only" image is required in which the fat or silicon resonance must be either saturated prior to each data acquisition or not excited at all.

Suppression Techniques

Techniques of fat suppression, generally referred to as FATSAT hereinafter, are well known in the prior art. Fat suppression is usually achieved by placing a narrow band spectral suppression pulse before the imaging sequence. This pre-pulse is quickly followed by the imaging sequence so that the fat protons do not have time to relax back to their equilibrium magnetization which remains dispersed (saturated) and unable to contribute signal to the image.

Figure 1:
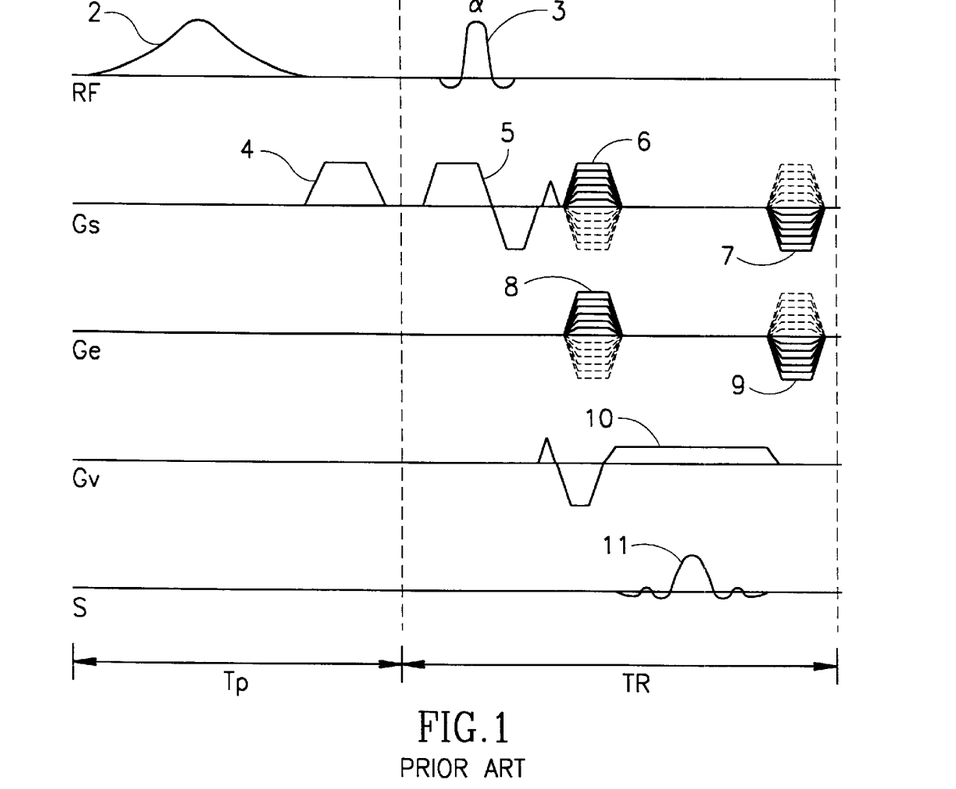
FIG. 1 is a schematic graph Illustrating a prior art 3D gradient-echo motion compensated sequence having a frequency selective simple gaussian FATSAT spectral suppression pulse.

Reference is now made to FIG. 1 which is a schematic graph Illustrating a prior art 3D gradient-echo motion compensated sequence having a frequency selective simple gaussian FATSAT spectral suppression pulse which is centered on the fat frequency. All the horizontal axes of FIG. 1 represent time. The double-headed arrow labeled Tp represents the presaturation sequence and the double-headed arrow labeled TR represents the imaging sequence. The graph labeled RF represents the RF imaging sequence which includes a gaussian spectral suppression pre-pulse 2 followed by an imaging RF pulse 3 having a flip angle α.

The vertical axis (not shown) of the graph labeled RF represents the amplitude of the RF pulses. The graphs labeled Gs, Ge and Gv represent the slice selection gradient, the phase encoding gradient and the viewing gradient sequences, respectively, the vertical axes (not shown) of the graphs labeled Gs, Ge and Gv represent the gradient magnetic field amplitude. The slice selection gradient sequence includes a three-lobed motion compensated gradient 5, a phase encoding gradient 6 and a rewinder gradient 7. The gradient pulse referenced 4 is a spoiler pulse which is part of the presaturation sequence Tp. The phase encoding axis sequence includes a phase encoding gradient 8 and a rewinder gradient 9. The viewing gradient sequence (readout gradient) includes a readout gradient 10.

The graph labeled S is the signal graph. The vertical axis (not shown) of the signal graph represents the RF echo signal amplitude. The signal graph includes the RF echo signal 11.

Figure 2:
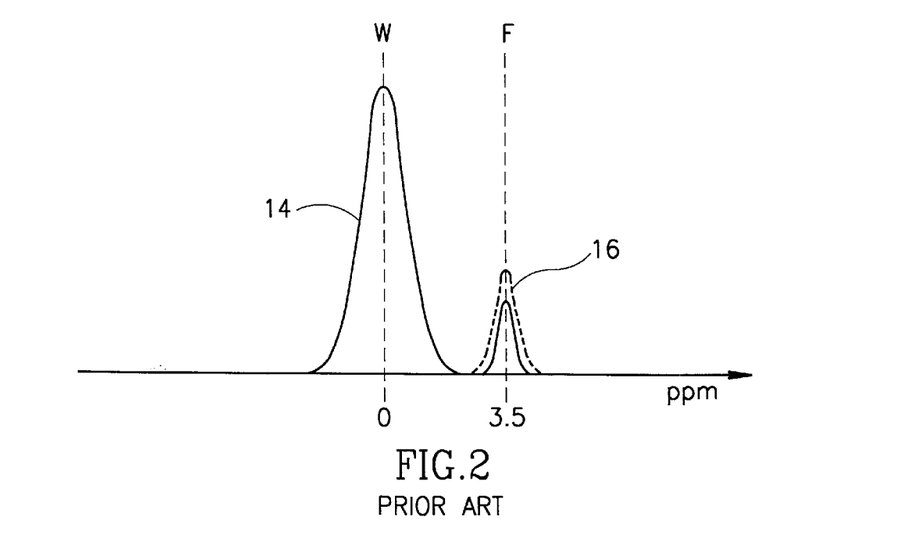
FIG. 2 is a schematic graph representing a prior art NMR spectrum of fat and water protons on which a fat gaussian spectral suppression pulse is superimposed.

Reference is now made to FIG. 2 which is a schematic graph representing a prior art NMR spectrum of fat and water protons on which a fat gaussian spectral suppression pulse is superimposed. The horizontal axis represents the chemical shift in parts per million (PPM) units. The curve labeled 14 represents the absorption spectrum of fat and water protons. The arrow labeled W indicates the peak absorption of the water protons at 0 ppm and the arrow labeled F indicates the peak of absorption of the fat protons which is shifted by 3.5 ppm relative to the peak absorption of the water protons. The excitation spectrum of a typical fat gaussian spectral suppression pulse 16 is superimposed on the absorption spectrum curve 14. The gaussian suppression pulse 16 is centered at the peak F and will thus selectively excite the fat protons without substantial excitation of the water protons. Suppression pulses using the Sinc function are also known in the art.

Gaussian and Sinc type suppression pulses are required to be long in duration in order to achieve a suitably narrow spectral selection. At a field strength of 2 Tesla a typical Sinc suppression pulse may take up to 26 ms.

Figure 3:
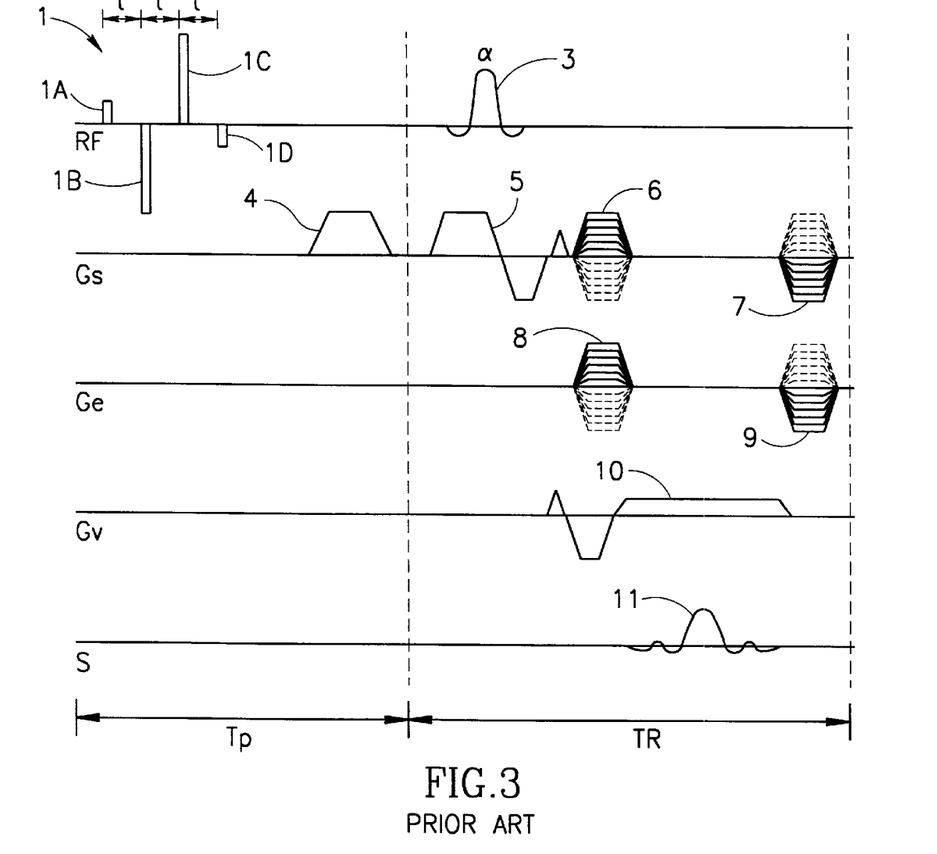
FIG. 3 is a schematic graph illustrating a prior art 3D gradient-echo imaging sequence having a frequency selective binomial FATSAT spectral suppression presaturation pulse centered on the water frequency.

Reference is now made to FIG. 3 which is a schematic graph illustrating a prior art 3D gradient-echo imaging sequence having a frequency selective binomial FATSAT spectral suppression presaturation pulse which is centered on the water frequency.

The fat suppression sequence of FIG. 3 uses a 1-3-3-1 binomial suppression pulse which is centered around the water frequency.

The use of binomial pulse suppression techniques is disclosed in an article appearing in The Journal of Magnetic Resonance, entitled "Solvent Suppression in Fourier Transform Nuclear Magnetic Resonance" by P. J. Hore (Vol. 55, 1983, pp. 283–300) incorporated herein by reference.

It is noted that for a better understanding, like components are designated by like reference numerals throughout the various figures.

The gradient-echo sequence of FIG. 3 is similar to the gradient-echo sequence of FIG. 1, except that the RF imaging sequence which includes a gaussian spectral suppression pre-pulse 2 of FIG. 3 includes a 1-3-3-1 binomial suppression pulse 1 instead of the gaussian spectral suppression pre-pulse 2 of FIG. 1. The 1-3-3-1 binomial suppression pulse 1 includes four sub-pulses 1A, 1B, 1C and 1D which are separated from each other by a pulse separation interval τ. Similar to the graphs of FIG. 1, the horizontal axes of the graphs of FIG. 3 represent time, the vertical axes (not shown) of the graphs labeled, Gs, Ge, Gv represent gradient magnetic field amplitude, the vertical axis (not shown) of the graph labeled RF represents the amplitude of the RF pulses and the vertical axis (not shown) of the graph labeled S represents the RF echo signal amplitude.

By choosing the appropriate pulse separation interval τ (dependent upon field strength and chemical species) the binomial pulse 1 exhibits a null excitation at the water frequency which rises to a 90° excitation at the fat frequency.

Figure 4:
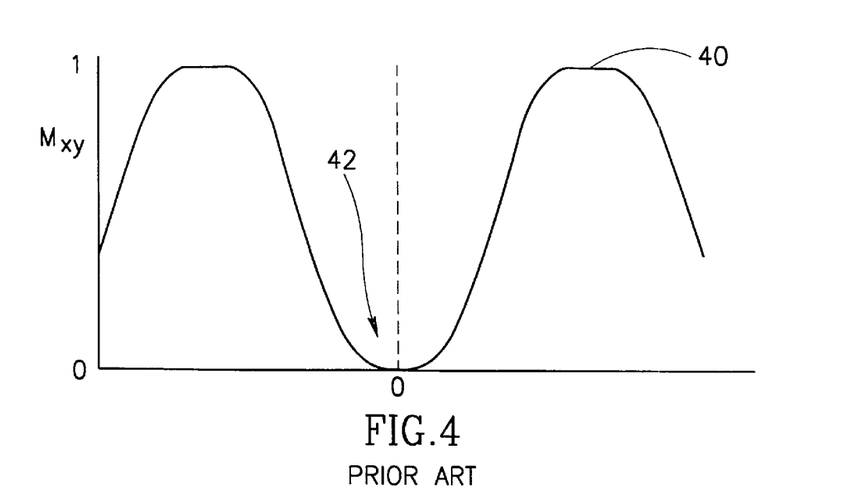
FIG. 4 is a schematic graph illustrating the theoretical excitation spectrum of a prior art 1-_3_-3-_1_ binomial suppression pulse as a function of frequency offset from the transmitter frequency.

Reference is now made to FIG. 4 which is a schematic graph illustrating the theoretical excitation spectrum of a prior art 1-3-3-1 binomial suppression pulse as a function of frequency offset from the transmitter frequency. The vertical axis of the graph represents the transverse magnetization $M_{xy}$ wherein full scale corresponds to complete conversion of Z magnetization into XY magnetization. The horizontal axis represents the offset from the transmitter frequency. The transverse magnetization curve 40 has a flat excitation null 42 around the transmitter frequency.

The binomial pulse sequence shown in FIG. 3 has a total duration of approximately 5.4 ms at 2 Tesla. This is somewhat shorter than the gaussian pulse 2 of FIG. 1 but requires a high RF power because of the short "hard" pulses.

Suppression techniques generally extend the minimum TR that can be used and result in a reduction in the number of slices that can be imaged in a multi-slice sequence. They are also limited when short TR's are required since rapid, repeated, and incomplete, saturation of the fat frequency inevitably leads to a build up of coherent fat signal resulting in image artifacts.

Spectral-spatial excitation methods

Methods of Spectral-Spatial Excitation use a carefully designed RF modulation in the presence of an oscillating gradient. The result is a simultaneous selection along one spatial axis and the frequency spectrum. The use of Spectral-spatial excitation is disclosed in an article appearing in Magnetic Resonance in Medicine, entitled "Simultaneous Spatial and Spectral selective Excitation" by Craig H. Meyer et al. (Vol. 15, 1990, pp. 287–304), incorporated herein by reference.

Figure 5:
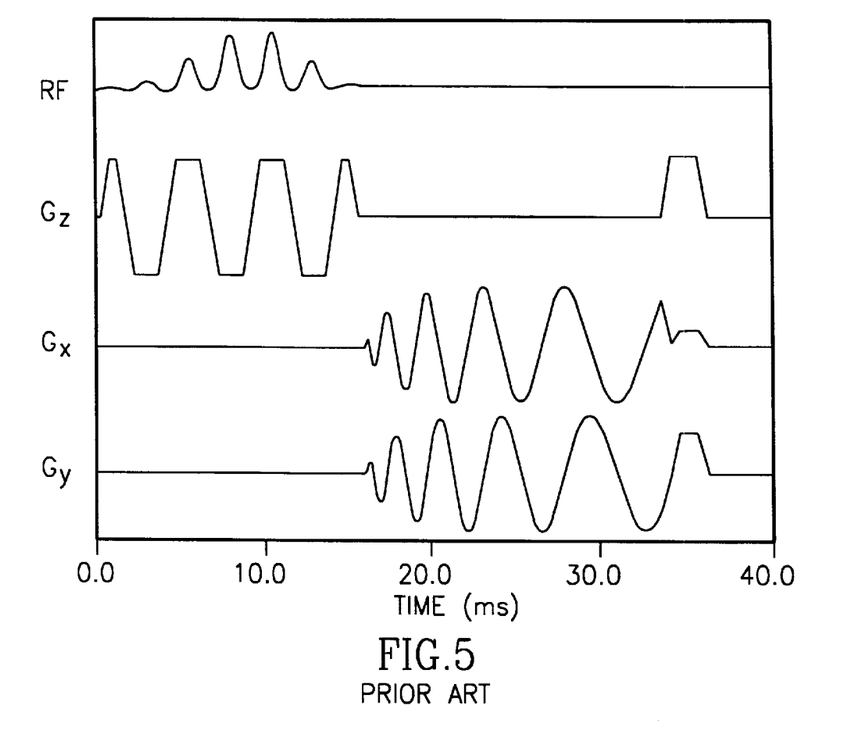
FIG. 5 is a schematic graph illustrating imaging sequences designed for a prior art spectral-spatial excitation method.

FIG. 5 is a schematic graph illustrating imaging sequences designed for a prior art spectral-spatial excitation method. The horizontal axes of all the graphs of FIG. 5 represent time. The graph labeled RF represents the RF "fat free" imaging sequence. The vertical axis (not shown) of the graph labeled RF represents the amplitude of the RF. The graphs labeled $G_z$, $G_x$ and $G_y$ represent the Gradient sequences wherein the horizontal axis represents time and the vertical axes (not shown) represent the magnetic field amplitude. The gradient sequence labeled $G_z$ is a modulated slice selection gradient. The gradient sequences labeled $G_x$ and $G_y$ are spiral readout gradients. Each of the gradients $G_z$, $G_x$ and $G_y$ is shown as having a rephasing pulse at the far end of the gradient pulse trains.

The frequency of the modulated gradient is calculated so that, when centered on the water resonance, an excitation null occurs at the fat resonance. In this way only the water resonance is excited. This kind of pulse is usually incorporated directly into the imaging sequence since it is designed to select the desired slice profile only at the water frequency.

Figure 6:
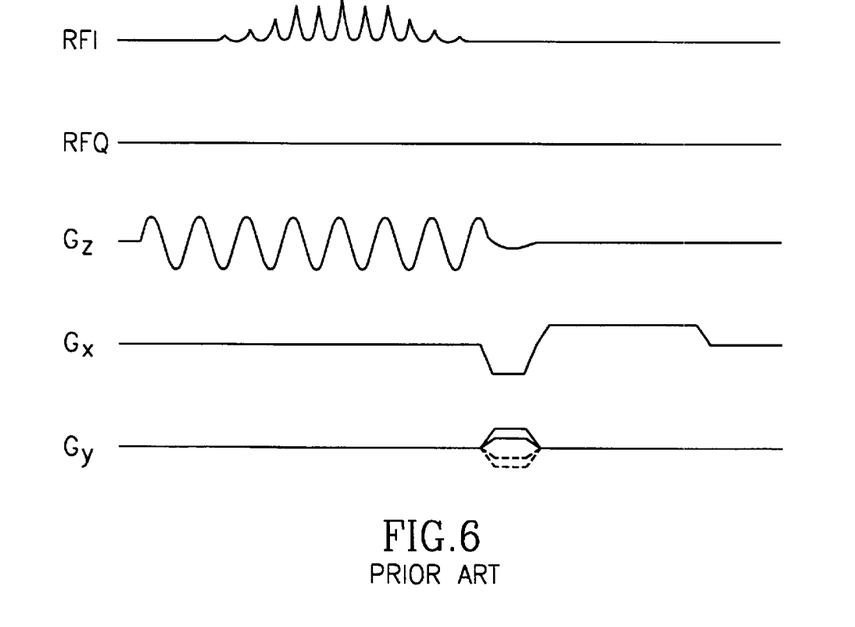
FIG. 6 is a schematic graph illustrating a prior art rapid gradient-echo pulse sequence using a spectral-spatial pulse with gaussian k-space varying along both $k_z$ and $k_\omega$.

Reference is now made to FIG. 6 which is a schematic graph illustrating a prior art rapid gradient-echo pulse sequence using a spectral-spatial pulse with gaussian k-space varying along both $k_z$ and $k_\omega$ as disclosed by Meyer et al. The horizontal axes of all graphs represent time. The graphs labeled RFI and RFQ represent the real and the imaginary components of the RF "fat free" imaging sequence, respectively. In the particular example of FIG. 6, there is no imaginary component as illustrated by the flat trace of the curve labeled RFQ. The vertical axis (not shown) of the graphs labeled RFI and RFQ represent RF signal amplitude. The graphs labeled $G_z$, $G_x$ and $G_y$ represent the Gradient sequences wherein the horizontal axis represents time and the vertical axes (not shown) represent the magnetic field amplitude. The gradient sequence labeled $G_z$ is a modulated slice selection gradient. The gradient sequences labeled $G_x$ is a readout gradient. The gradient sequence $G_y$ is a phase encoding gradient. This pulse sequence results in compact spatial and spectral slice profiles (not shown) which are gaussian in shape in the small-tip-angle regime.

Spectral-spatial techniques have the advantage of exciting only the chemical species of interest. Because of this, no sacrifice is necessary on the repetition time (TR).

However, spectral-spatial pulses are limited by gradient performance and are especially limited for low field applications where they are prohibitively long in duration. Additionally, careful optimization is required to ensure good spectral selection.

SUMMARY OF THE INVENTION

There is therefore provided, in accordance with an embodiment of the present invention, a method for performing motion-compensated spectral-spatial selective magnetic resonance imaging. The method includes applying a radio frequency (RF) spectral-spatial excitation sequence to a region of a body. The excitation sequence includes a binomial slice-selective pulse train including at least two sub-pulses. The binomial pulse train also provides spectrally selective excitation of a selected resonance frequency at a predetermined field strength. The method further includes applying to the same region of the body an oscillating slice selection gradient so that each sub-pulse of the binomial pulse train is applied during portions of the oscillating gradient having the same polarity. The oscillating gradient further includes at least one extra gradient switch added to the end of the oscillating gradient for providing inherently motion compensated slice selection. The method thereby provides an improved dynamic range of MRI imaging.

Further, in accordance with another embodiment of the present invention, the selected resonance frequency is the water resonance frequency for the predetermined field strength thereby reducing artifacts due to excitation of the fat resonance frequency and providing substantially fat free images.

Further still, in accordance with yet another embodiment of the present invention, the binomial pulse train of the RF excitation sequence is phase modulated in order to shorten the duration of the slice selection process and minimize the TE duration.

Furthermore, in accordance with another embodiment of the present invention, the binomial pulse train is a 1-2-1 binomial pulse train.

Furthermore, in accordance with another embodiment of the present invention, the binomial pulse train is a 1-3-3-1 binomial pulse train.

Furthermore, in accordance with another embodiment of the present invention, the envelope of each sub-pulse of the RF exitation sequence is modified to correct for the effect of the time varying of the waveform of the oscillating slice selection gradient, by using non-linear sampling methods or other suitable methods of pulse envelope correcting, thereby maintaining the fidelity of the slice excitation profile.

Furthermore, in accordance with another embodiment of the present invention, the spectrally selective excitation at a selected resonance frequency is produced by selecting the spacing interval between the sub-pulses of the binomial pulse train in accordance with the predetermined field strength.

Furthermore, in accordance with another embodiment of the present invention, each sub-pulse of the binomial pulse train is applied during portions of the oscillating gradient having identical gradients.

Furthermore, in accordance with another embodiment of the present invention, each sub-pulse of the binomial pulse train is applied during positive gradient portions of the oscillating gradient.

Furthermore, in accordance with another embodiment of the present invention, the selected resonance frequency is the water resonance frequency at the predetermined field strength.

There is also provided, in accordance with another embodiment of the present invention, a method for performing motion-compensated spectral-spatial selective magnetic resonance angiography. The method includes applying a radio frequency (RF) spectral-spatial excitation sequence to a region of a body. The excitation sequence includes a binomial pulse train having at least two sub-pulses. Each of the sub-pulses of the binomial pulse train has an envelope optimized for providing slice-variable tip angle producing a spatially varying slice-excitation-profile for a predetermined range of blood flow velocities and slab widths and a predetermined magnetic field strength. The binomial pulse train also provides spectrally selective excitation of a selected resonance frequency at the predetermined field strength. The method also includes applying to the same region of the body an oscillating slice selection gradient so that each sub-pulse of the binomial pulse train is applied during portions of the oscillating gradient having the same polarity. The oscillating gradient further includes at least one extra gradient switch added to the end of the oscillating gradient for providing inherently flow compensated slice selection. The method provides an improved dynamic range of the MR angiography and an improved small vessel visualization.

Furthermore, in accordance with another embodiment of the present invention, the spatially varying slice excitation profile is a non-linearly increasing slice excitation profile.

Further yet, in accordance with another embodiment of the present invention, the selected resonance frequency is the water resonance frequency for the predetermined field strength thereby reducing artifacts due to excitation of the fat resonance frequency and providing substantially fat free images.

Furthermore, in accordance with another embodiment of the present invention, the binomial pulse train of the RF excitation sequence is phase modulated in order to shorten the duration of the slice selection process and minimize the TE duration.

Furthermore, in accordance with another embodiment of the present invention, the binomial pulse train is a 1-2-1 binomial pulse train.

Furthermore, in accordance with yet another embodiment of the present invention, the binomial pulse train is a 1-3-3-1 binomial pulse train.

Furthermore, in accordance with another embodiment of the present invention, the envelope of each sub-pulse of the RF excitation sequence is modified to correct for the effect of the time varying of the waveform of the oscillating slice selection gradient, thereby maintaining the fidelity of the slice excitation profile.

Furthermore, in accordance with another embodiment of the present invention, the spectrally selective excitation at a selected resonance frequency is produced by selecting the spacing interval between the sub-pulses of the binomial pulse train in accordance with the predetermined field strength.

Furthermore, in accordance with another embodiment of the present invention, each sub-pulse of the binomial pulse train is applied during portions of the oscillating gradient having identical gradients.

Furthermore, in accordance with another embodiment of the present invention, each individual pulse of the binomial pulse train is applied during positive gradient portions of the oscillating gradient.

Finally, in accordance with another embodiment of the present invention, the selected resonance frequency is the water resonance frequency at the predetermined field strength.

BRIEF DESCRIPTION OF THE DRAWINGS

The invention is herein described, by way of example only, with reference to the accompanying drawings, wherein.

DETAILED DESCRIPTION OF THE INVENTION

While the invention has been described with respect to a limited number of embodiments, it will be appreciated that many variations, modifications and other applications of the invention may be made.

Binomial Spectral Spatial Excitation

The binomial spectral-spatial excitation method, referred to as the BINSS method hereinafter, combines the simplicity and compact nature of binomial pulses with the principle of spectral-spatial excitation to produce a slice selection pulse which has excellent selectivity in both the spectral and spatial domains.

Figure 7:
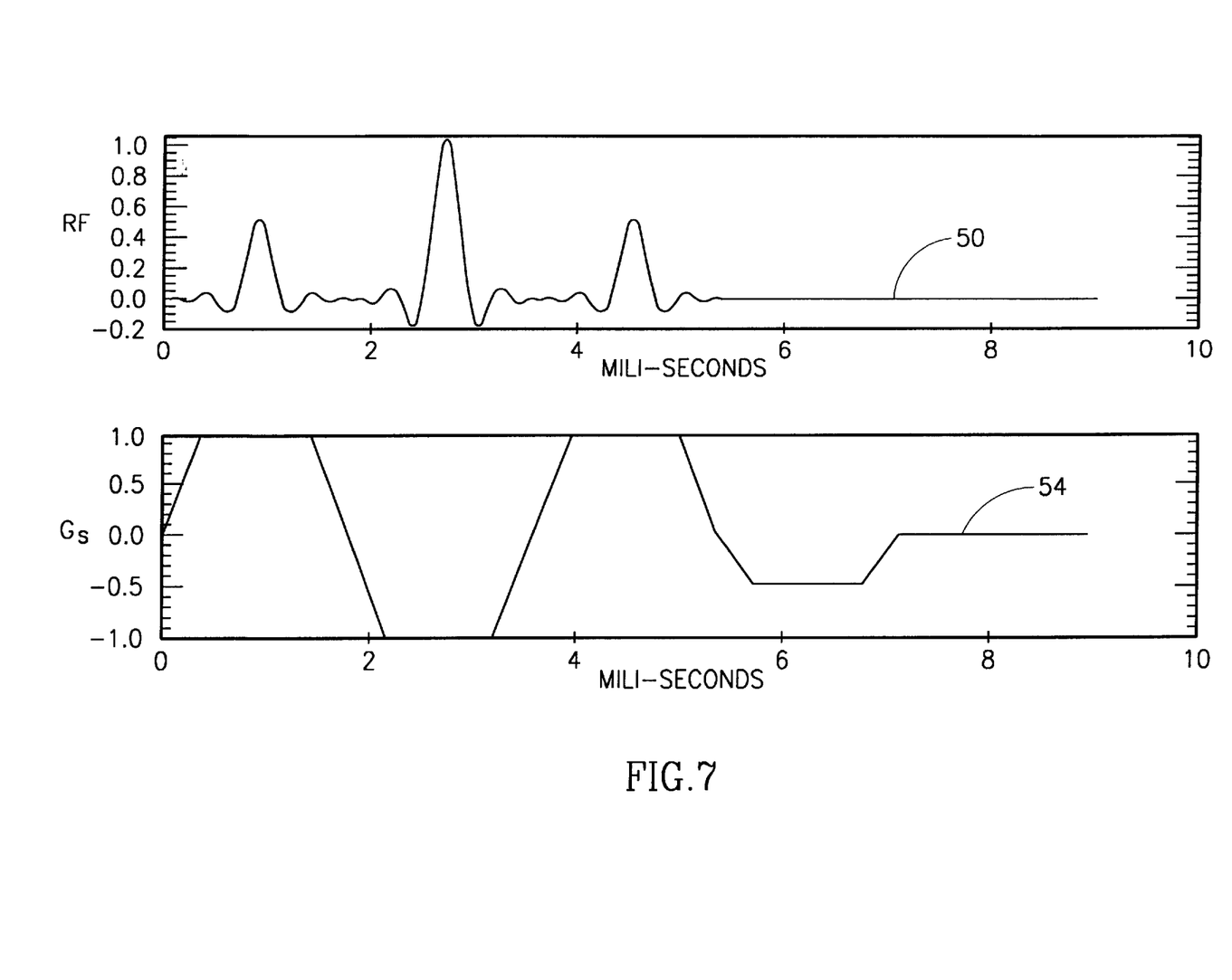
FIG. 7 is a schematic graph illustrating a 1-2-1 binomial spectral-spatial (BINSS) RF pulse together with the slice selection gradient selected for that pulse.

Reference is now made to FIG. 7 which is a schematic graph illustrating a 1-2-1 BINSS RF pulse together with the slice selection gradient selected for that pulse, in accordance with an embodiment of the present invention. In the graph labeled RF of FIG. 7 the curve labeled 50 represents the normalized magnitude of the binomial RF fat free imaging pulse. The horizontal axis represents time and the vertical axis represent the normalized amplitude of the RF sequence. In the graph of FIG. 7 labeled Gs, the curve labeled 54 represents the modulated slice selection gradient sequence. The horizontal axis represents time and the vertical axis represents the normalized amplitude of the slice selection gradient. The phase encoding gradient and the viewing gradient are not shown.

The correct sub-pulse spacing $\tau$ for "water only" imaging at a selected field strength is given by:

$$\tau = \frac{1}{2 \cdot \Delta f_{FAT}}$$

wherein $\Delta f_{FAT}$ is the frequency separation between the fat and the water resonance for the selected field strength.

The calculated value of $\tau$, at a field strength of 2 Tesla, is 1784 micro-seconds. For the binomial 1-2-1 RF sequence of FIG. 7, three sub-pulses are required leading to a total pulse duration of 5.352 ms as opposed to the 10.7 ms required for prior art spectral-spatial pulses.

At a field strength of 0.5 Tesla (not shown) the pulse spacing is 6756 micro-seconds. For a 1-2-1 binomial pulse at a field strength of 0.5 Tesla the total pulse duration is 20 ms, in contrast to the 40.5 ms required for prior art spectral-spatial pulses.

Non-Linear Correction of Sub-Pulses

Because the RF pulses are applied under a time varying gradient waveform, it is necessary to correct the sub-pulse shape to take the gradient waveform into account so that fidelity in the slice profile is maintained.

Binomial spectral-spatial pulse sequences are shorter in duration thus enabling shorter TE's in imaging. Additionally, a saving in gradient performance by a factor of 2, for the same slice thickness, is obtained when using the BINSS pulse over prior art. Furthermore, the BINSS pulse can be made arbitrarily longer or shorter by using other binomial series. For example, a 1-3-3-1 binomial pulse train can be used at high magnetic field strengths such as 2 Tesla, while a 1-2-1 binomial pulse train can be used for spectral-spatial excitation at lower field strengths, such as 0.5 Tesla.

Spatial and Spectral Response of BINSS pulse

Figure 8:
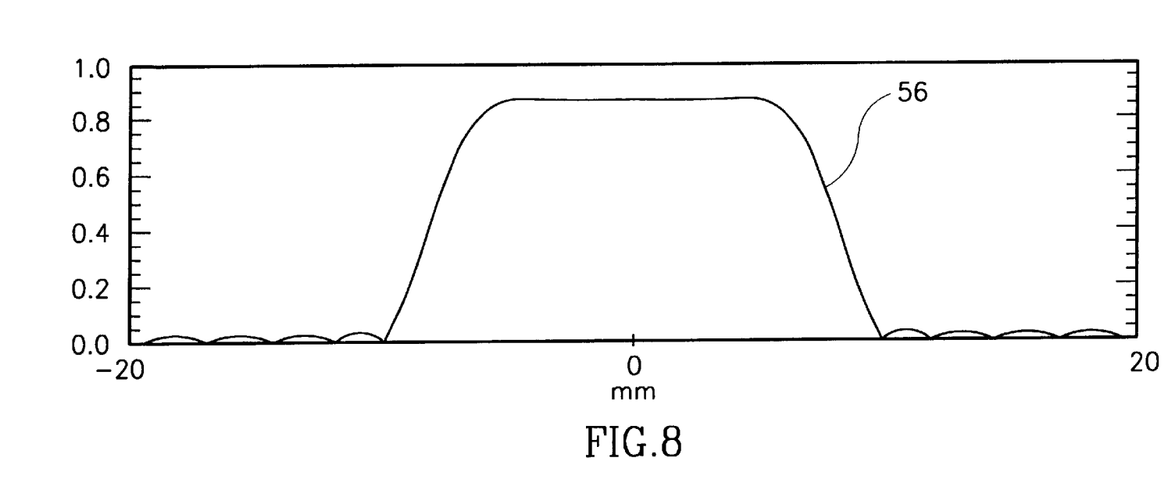
FIG. 8 is a schematic graph illustrating the slice profile of the BINSS pulse of FIG. 7.
Figure 9:
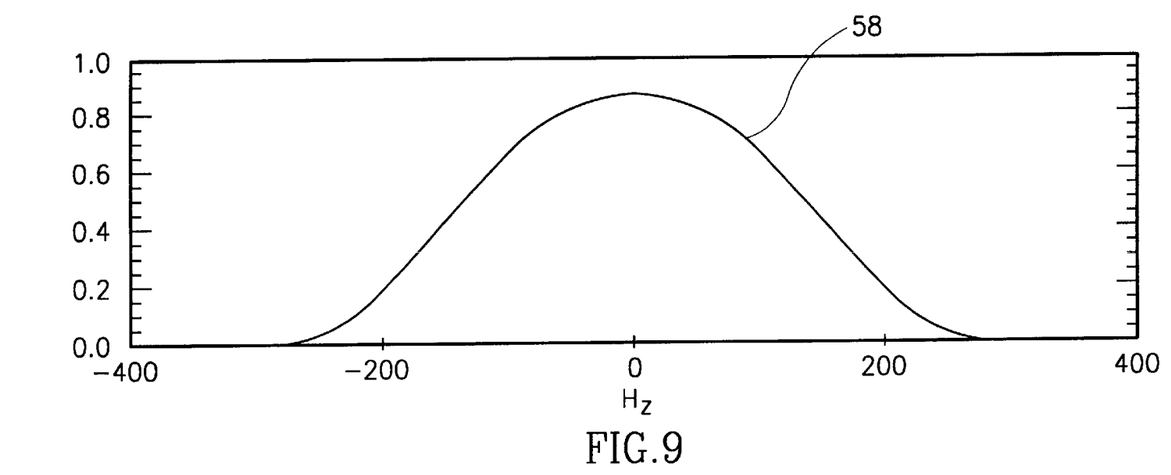
FIG. 9 is a schematic graph illustrating the spectral response of the BINSS pulse of FIG. 7.

Reference is now made to FIGS. 8 and 9. Which are schematic graphs illustrating the slice profile and the spectral response of the BINNS pulse of FIG. 7.

FIG. 8 illustrates the simulated slice profile curve 56 generated by the 5.532 ms 1-2-1 BINSS pulse of FIG. 7. The horizontal axis represents the distance along the spatial selection coordinate and the vertical axis represents the normalized excitation amplitude. It is noted that the slice profile is symmetrical.

FIG. 9 illustrates the spectral response curve 58 of the BINSS pulse of FIG. 7. The horizontal axis represents the frequency in Hz relative to the water resonance frequency (at a field strength of 2 Tesla) and the vertical axis represents the normalized excitation amplitude. The peak excitation is at the Water resonance frequency.

Motion Compensated spectral-spatial BINSS pulse

Figure 10:
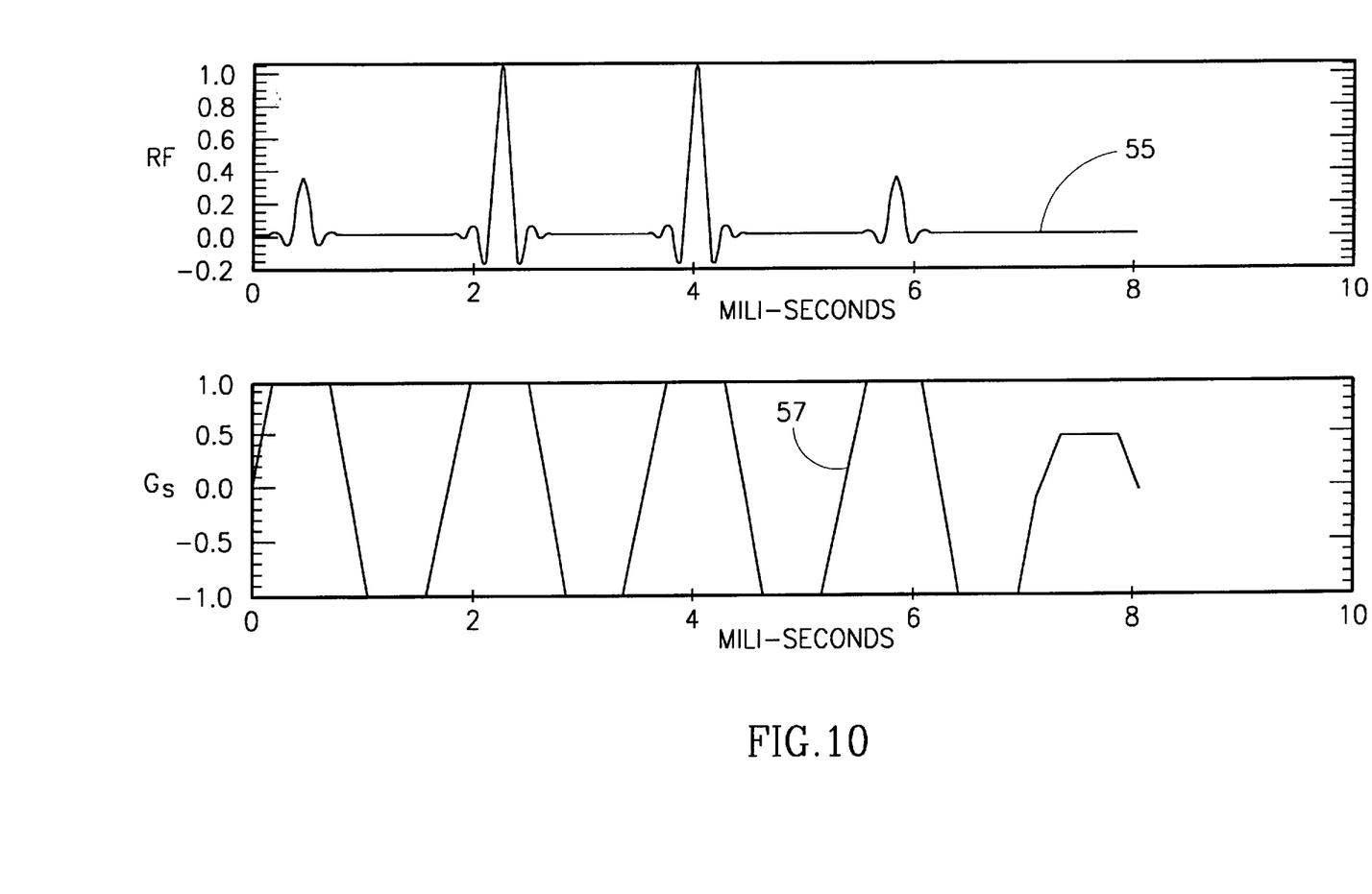
FIG. 10 is a schematic graph illustrating a motion compensated 1-3-3-1 BINSS pulse and a slice selection gradient designed for fat free imaging in accordance with an embodiment of the present invention.

Reference is now made to FIG. 10 which is a schematic graph illustrating a motion compensated spectral-spatial 1-3-3-1 BINSS pulse and a slice selection gradient designed for fat free imaging in accordance with an embodiment of the present invention. The graph labeled RF illustrates the RF BINSS pulse and the graph labeled Gs illustrates the slice selection gradient. The curve labeled 55 represents the real component of the binomial RF fat free imaging sequence. It is noted that, the pulse sequence has a null imaginary component (not shown). The horizontal axis represents time and the vertical axis represents the normalized amplitude of the RF sequence for the graph labeled RF. The curve labeled 57 represents the modulated slice selection gradient sequence. In the graph labeled Gs, the horizontal axis represents time and the vertical axis represents the normalized gradient amplitude along the Z axis. The gradient is switched at double the rate of the corresponding gradient of FIG. 7 and the sub-pulses of the binomial RF pulse sequence are applied during the positive gradient switches only.

The phase encoding and the viewing gradients for the RF pulse of FIG. 10 are not shown.

The end of the gradient waveform 57 is balanced using the prior art method of gradient moment nulling (GMN), so that motion compensation is achieved. Since the RF sub-pulses are applied during the same gradient polarity each time there is no need to modulate the phase of the pulses in order to achieve shifted slices. Thus, in contrast to the 1-2-1 BINSS pulse of FIG. 7 having sub-pulses applied during opposite gradient polarities, the sub-pulses of the 1-3-3-1 BINSS pulse of FIG. 10 are applied during the same gradient polarities, thus, taking advantage of the inherent motion-compensation of the switched gradient.

It is noted that the sub-pulses of the binomial RF pulse sequence can also be applied during the negative gradient switches as long as they are applied during the same gradient polarity each time.

Figure 11:
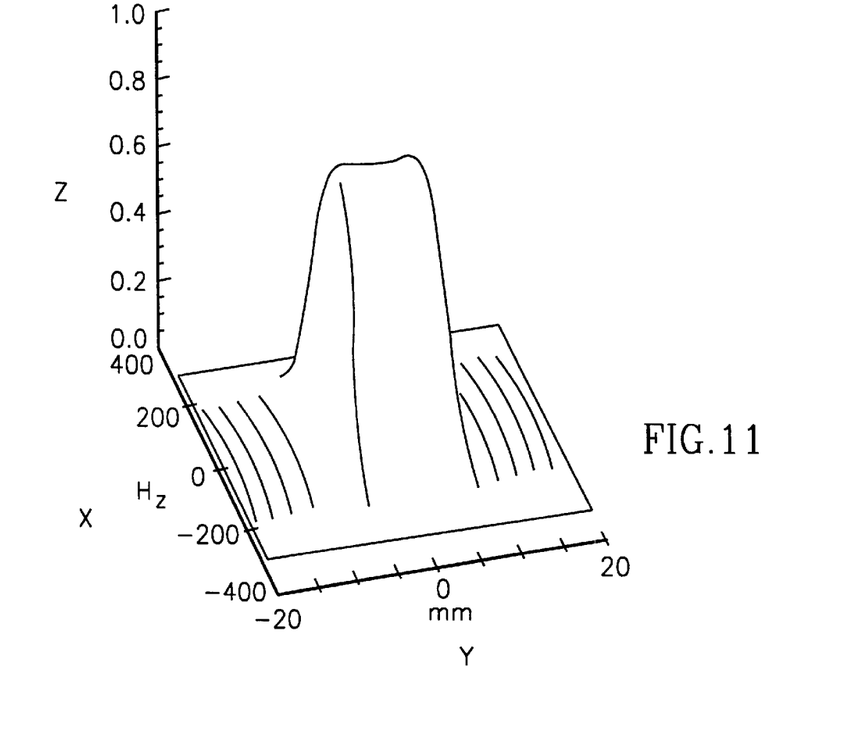
FIG. 11 is a schematic three dimensional graph illustrating the spectral and spatial selectivity of the RF pulse sequence of FIG. 10.
Figure 12:
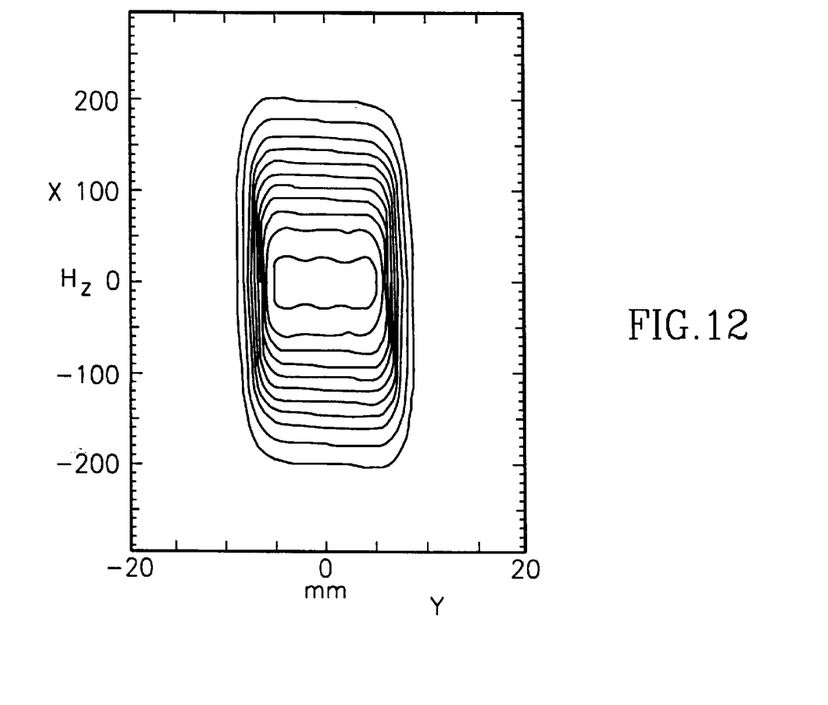
FIG. 12 is a schematic 2-dimensional contour graph illustrating the spectral and spatial selectivity of the RF pulse sequence of FIG. 10.

Reference is now made to FIGS. 11 and 12. FIG. 11 is a schematic three dimensional graph illustrating the spectral and spatial selectivity of the RF pulse sequence of FIG. 10. The horizontal axes labeled X, and Y represent the relative frequency (spectral axis) and the slice excitation profile (spatial axis), respectively. The vertical axis represents the final magnetization Mxy of the 7.136 ms 1-3-3-1 BINSS pulse for water-only excitation at 2 Tesla.

FIG. 12 is a schematic 2-dimensional contour graph illustrating the spectral and spatial selectivity of the RF pulse sequence of FIG. 10. The horizontal axes labeled X, and Y represent the relative frequency (spectral axis) and the slice excitation profile (spatial axis), while the contour lines represent lines of equal final magnetization Mxy.

Figure 13:
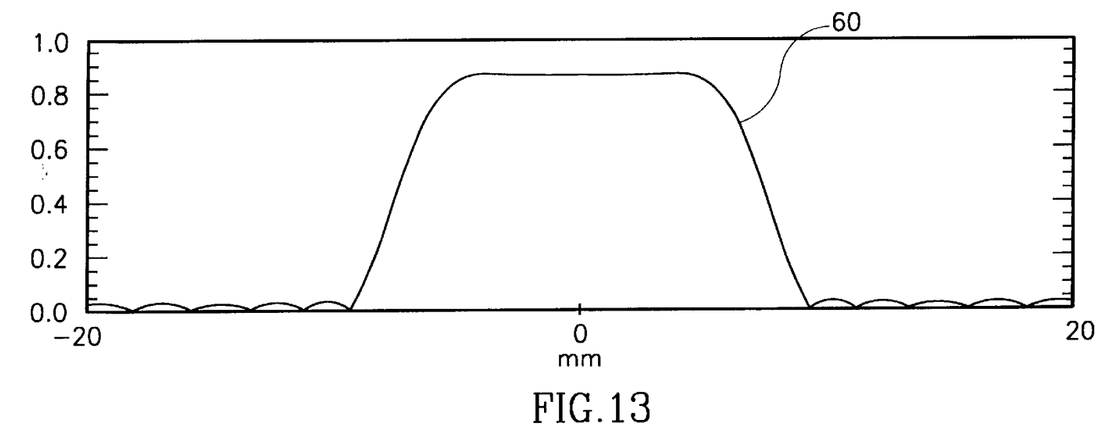
FIG. 13 is a schematic graph illustrating the simulated slice profile generated by the 1-3-3-1 BINSS pulse of FIG. 10.
Figure 14:
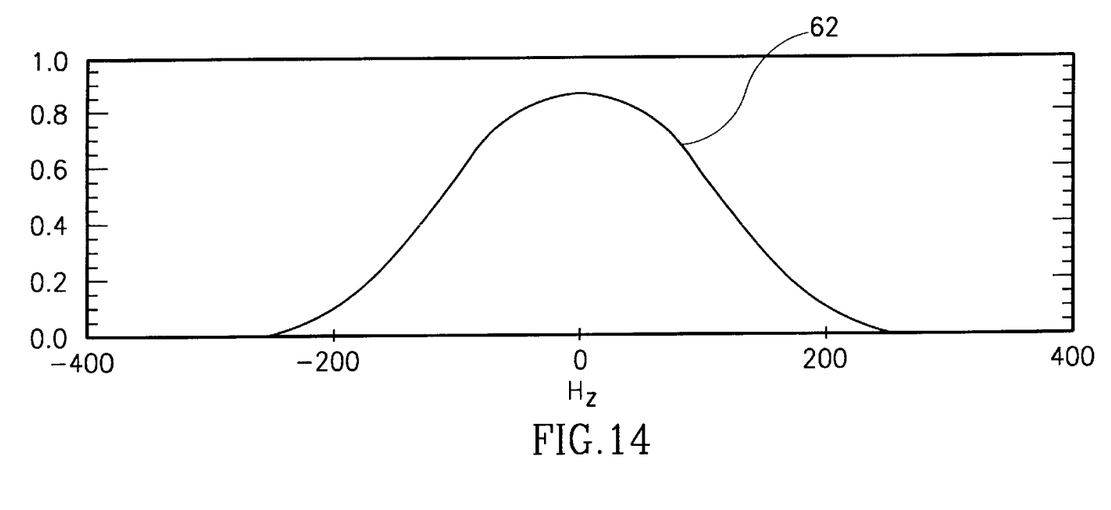
FIG. 14 is a schematic graph illustrating the spectral response curve of the 1-3-3-1 BINSS pulse of FIG. 10.

Reference is now made to FIGS. 13 and 14. FIG. 13 is a schematic graph illustrating the simulated slice profile curve referenced 60 generated by the 7.136 ms 1-3-3-1 BINSS pulse of FIG. 10. The horizontal axis represents the distance along the spatial selection axis and the vertical axis represents the normalized excitation amplitude. It is noted that the slice profile is symmetrical.

FIG. 14 is a schematic graph illustrating the spectral response curve referenced 62 of the BINSS pulse of FIG. 10. The horizontal axis represents the frequency in Hz relative to the water resonance frequency (at a field strength of 2 Tesla) and the vertical axis represents the normalized excitation amplitude. The peak excitation is at the Water resonance frequency.

Motion Compensated slice variable tip angle BINSS pulse angiography

Figure 15:
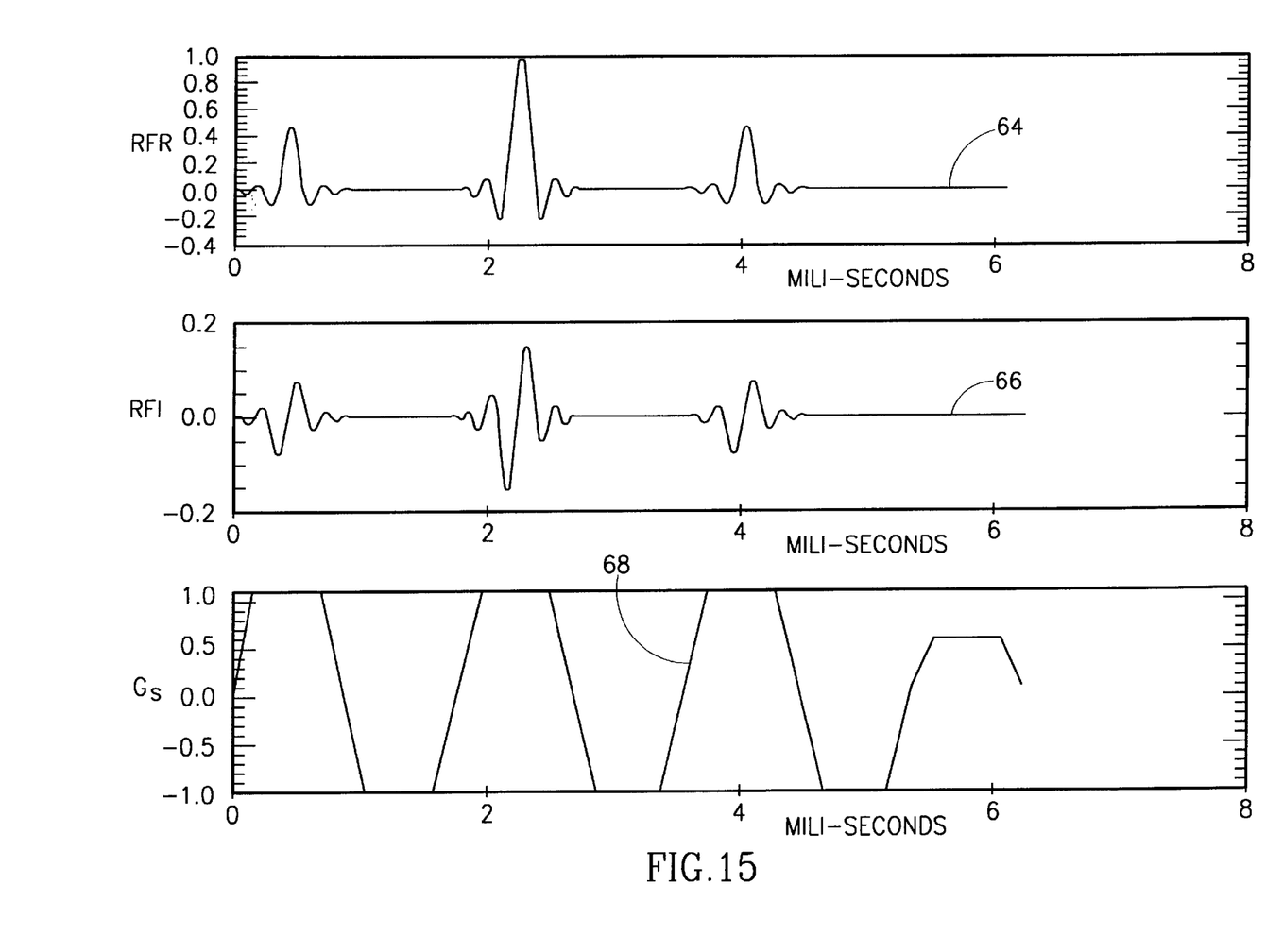
FIG. 15 is a schematic graph illustrating a complex 1-2-1 BINSS pulse sequence designed for fat-free angiography using motion compensated binomial-spectral-spatial-slice-variable-tip-angle RF slice selection in accordance with another embodiment of the present invention.

Reference in now made to FIG. 15 which is a schematic graph illustrating a complex 1-2-1 BINSS pulse sequence designed for fat-free angiography using motion compensated binomial-spectral-spatial-slice-variable-tip-angle RF slice selection in accordance with another embodiment of the present invention. The curve 64 of the graph labeled RFR represents the real component of the binomial RF fat free imaging sequence. The horizontal axis represents time and the vertical axis represents the normalized amplitude of the real component of the complex RF pulse.

The curve 66 of the graph labeled RFI represents the imaginary component of the binomial RF fat free imaging sequence. The horizontal axis represents time and the vertical axis represents the amplitude of the imaginary component of the complex RF pulse. It is noted that, the curves 64 and 66 of the graphs labeled RFR and RFI, respectively, together represent the normalised complex RF pulse.

The curve 68 of the graph labeled GS represents a balanced modulated slice selection gradient sequence wherein the horizontal axis represents time and the vertical axis represents the normalized gradient amplitude along the Z axis. It is noted that, while the slice selection gradient of the exemplary sequence of FIG. 15 is applied to the Z axis, the slice selection gradient can be applied to another spatial axis (not shown) such as the X or Y axis depending on the application. Additionally, more than one slice selection gradient can be applied to selected axis combinations (not shown) depending on the application. The phase encoding and the viewing gradients for the RF pulse of FIG. 15 are not shown.

Each of the three RF sub-pulses are complex pulses designed to generated a slice profile in which the tip angle varies across the slice. The use of RF pulses for generating variable tip-angle slice profiles (referred to as SVTA pulse, hereinafter) is already widely used in inflow angiography. For example, the use of an SVTA pulse is disclosed in an article appearing in SMRM abstracts, entitled "Optimized Slab Profile for 3D-TOF Angiography" by Yuval Zur (Abstract 960, 1994), incorporated herein by reference.

Incorporating an SVTA pulse envelope in a 1-2-1 BINSS pulse combined with a motion compensated slice selection gradient waveform provides an improved method of slice selection for performing fat free angiography. The optimized sub-pulses of the 1-2-1 RF pulse sequence of FIG. 15 were calculated using the method disclosed by Yuval Zur. The advantages of using water only excitation in angiography are the greater dynamic range and improved small vessel visualization.

Figure 16:
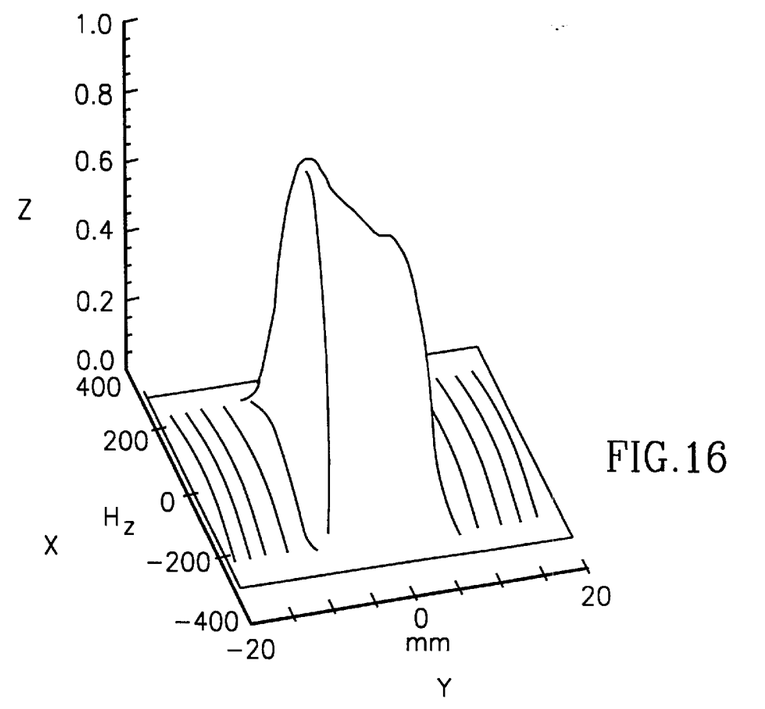
FIG. 16 is a schematic three dimensional graph illustrating the spectral and spatial selectivity of the 1-2-1 BINSS pulse of FIG. 15.
Figure 17:
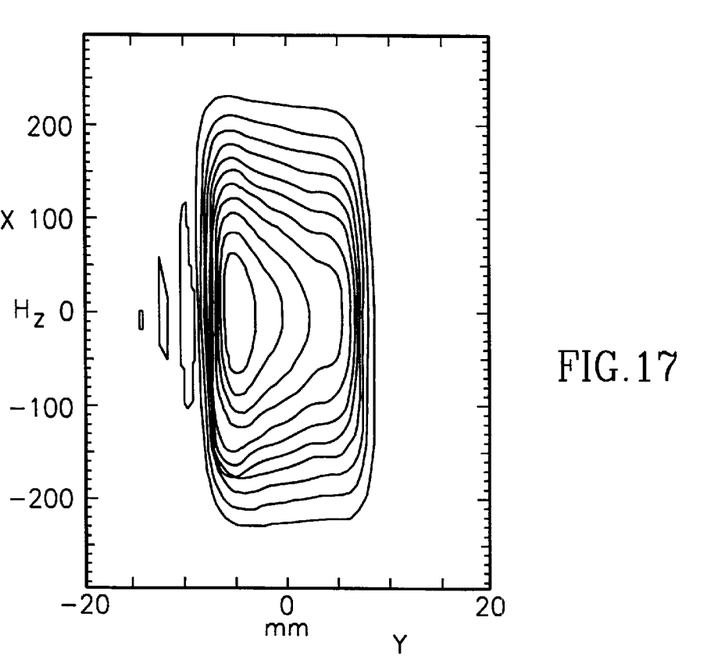
FIG. 17 is a schematic 2-dimensional contour graph illustrating the spectral and spatial selectivity of the 1-2-1 BINSS pulse of FIG. 15.

Reference is now made to FIGS. 16 and 17. FIG. 16 is a schematic three dimensional graph illustrating the spectral and spatial selectivity of the RF pulse sequence of FIG. 15. The horizontal axes labeled X, and Y represent the relative frequency (spectral axis) and the slice excitation profile (spatial axis), respectively. The vertical axis Z represents the final magnetization Mxy of the 5.352 ms 1-2-1 BINSS pulse for water only excitation at a magnetic field strength of 2 Tesla.

FIG. 17 is a schematic 2-dimensional contour graph illustrating the spectral and spatial selectivity of the RF pulse sequence of FIG. 15. The horizontal axes labeled X, and Y represent the relative frequency (spectral axis) and the slice excitation profile (spatial axis), while the contour lines represent lines of equal final magnetization Mxy.

Figure 18:
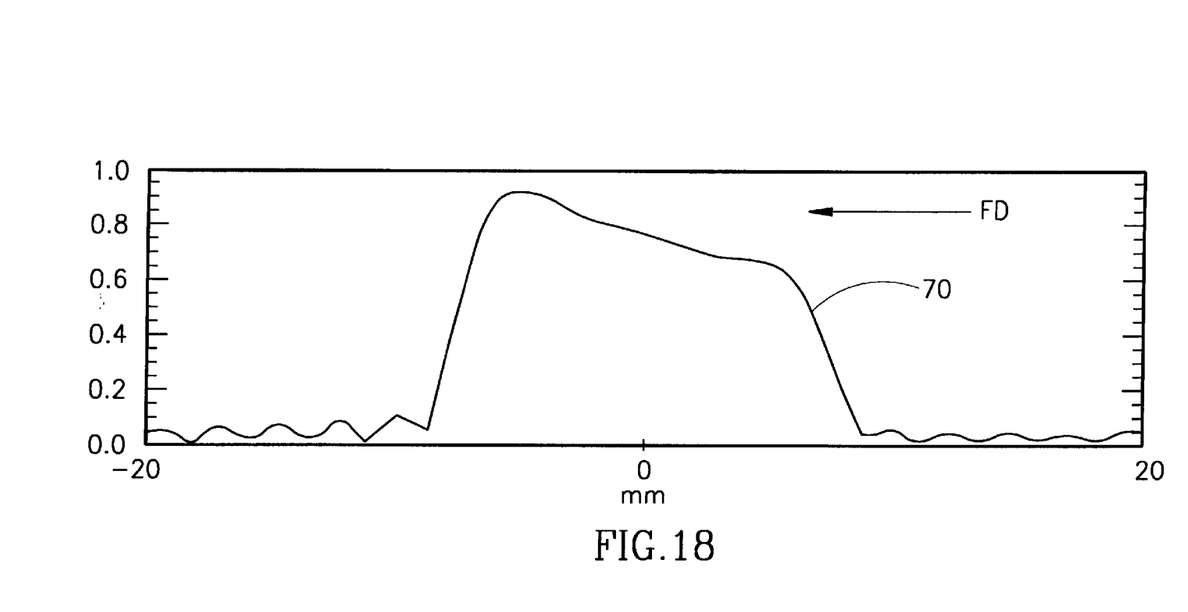
FIG. 18 is a schematic graph illustrating the simulated slice profile curve generated by the 1-2-1 BINSS pulse of FIG. 15.
Figure 19:
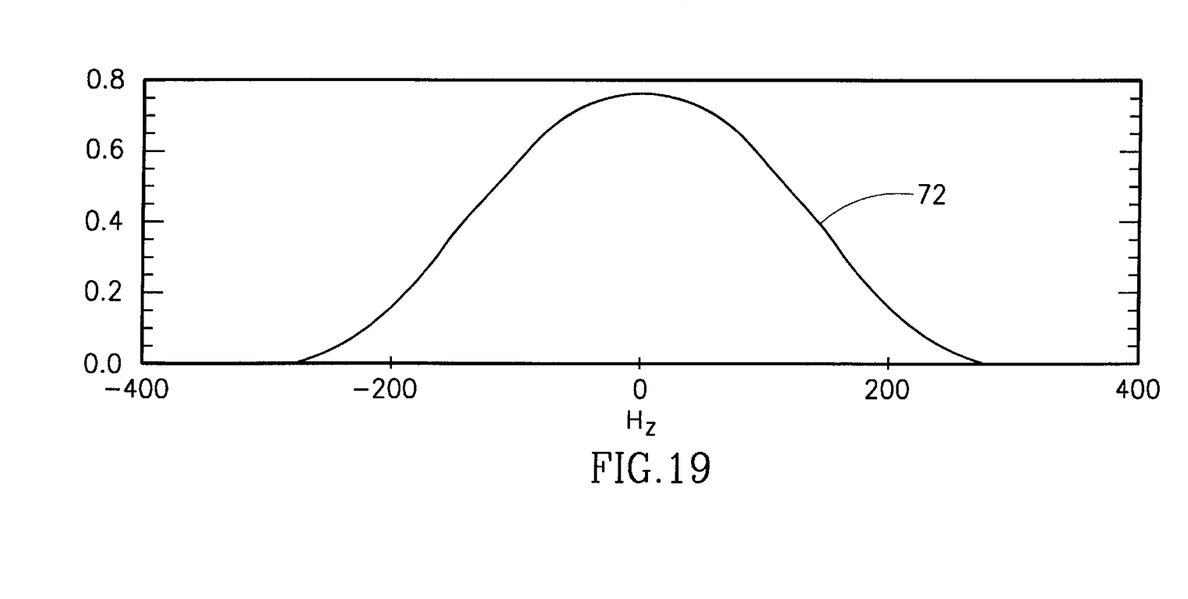
FIG. 19 is a schematic graph illustrating the simulated spectral response curve of the 1-2-1 BINSS pulse of FIG. 15.

Reference is now made to FIGS. 18 and 19. FIG. 18 is a schematic graph illustrating the simulated slice profile curve referenced 70 generated by the 1-2-1 BINSS pulse of FIG. 15. The horizontal axis represents the distance along the spatial selection axis and the vertical axis represents the normalized excitation amplitude. It is noted that the slice profile is non-symmetrical and increases non-linearly in the blood flow direction. The arrow labeled FD represents the blood flow direction.

FIG. 19 is a schematic graph illustrating the simulated spectral response curve referenced 72 of the BINSS pulse of FIG. 15. The horizontal axis represents the frequency in Hz relative to the water resonance frequency (at a field strength of 2 Tesla) and the vertical axis represents the normalized excitation amplitude. The peak of the spectral response curve 72 is at the water resonance frequency. It is noted that the excitation amplitude at the fat frequency which is offset from the water resonance by −280 Hz ( at a field strength of 2 Tesla) is almost null indicating the selective excitation of water protons.

Figure 20:
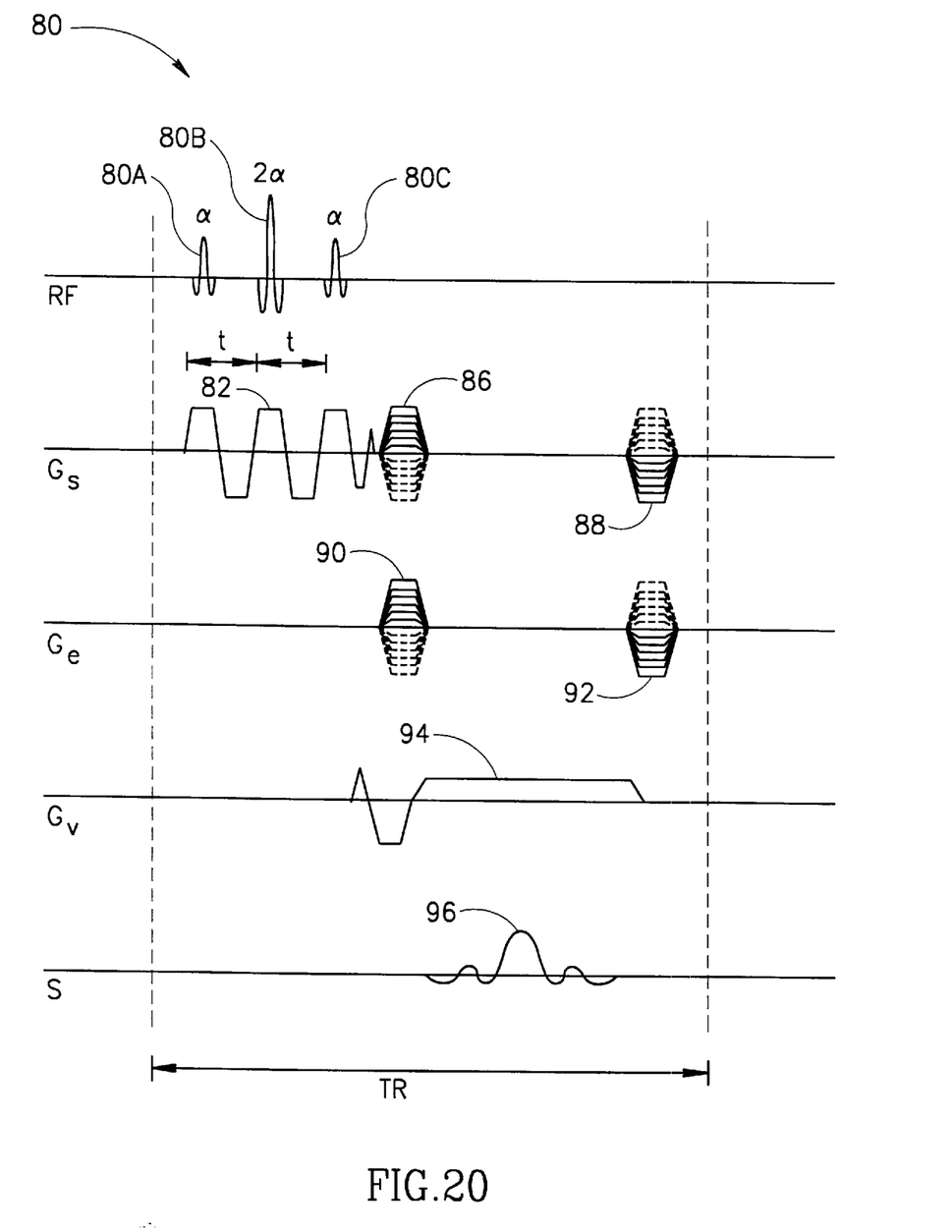
FIG. 20 is a schematic graph illustrating a full imaging sequence for fat-free angiography using a motion compensated 1-2-1 binomial-spectral-spatial-slice-variable-tip-angle RF slice selection in accordance with another embodiment of the present invention.

Reference is now made to FIG. 20 which is a schematic graph illustrating a full imaging sequence for fat-free angiography using motion compensated 1-2-1 binomial-spectral-spatial-slice-variable-tip-angle RF slice selection in accordance with yet another embodiment of the present invention. All the horizontal axes of FIG. 20 represent time. The double-headed arrow labeled TR represents the imaging sequence. The graph labeled RF represents the RF imaging sequence which includes a 1-2-1 binomial pulse train 80. The pulse train 80 includes three sub-pulses 80A, 80B and 80C, having flip angles α, 2α and α, respectively. The sub-pulse separation interval is τ. The vertical axis (not shown) of the graph labeled RF represents the amplitude of the RF pulses.

It is noted that, the RF pulse 80 can be a complex or a non-complex RF pulse.

The graphs labeled Gs, Ge and Gv represent the slice selection gradient, the phase encoding gradient and the viewing gradient sequences, respectively, the vertical axes (not shown) of the graphs labeled Gs, Ge and Gv represent the gradient magnetic field amplitude. The slice selection gradient sequence includes a balanced seven-lobed motion compensated gradient 82, a phase encoding gradient 86 and a rewinder gradient 88. The phase encoding axis sequence includes a phase selection gradient 90 and a rewinder gradient 92. The viewing gradient sequence (readout gradient) includes a readout gradient 94.

The graph labeled S is the signal graph. The vertical axis (not shown) of the signal graph represents the RF echo signal amplitude. The signal graph includes the RF echo signal 96.

It is noted that, while the exemplary embodiment of FIG. 20 uses a 1-2-1 binomial RF pulse, other suitable types of binomial RF pulses such as 1-3-3-1 or 1-<u>3</u>-3-<u>1</u> can be used by suitably optimizing the gradient sequences to conserve their motion compensating design.

It will be appreciated by those skilled in the art that, while the embodiments disclosed hereinabove are applied for the non-limiting example of spectrally selective water protons excitation (with fat non-excitation), the method of the present invention can be applied to the selective excitation of other species such as fat protons (with water non-exctation) and is generally applicable for selective excitation of a desired species in the presence of other interfering species having a resonance frequency which is close but not identical to the resonance frequency of the desired species.

It will be appreciated by those skilled in the art, that the present invention is not limited to what have been particularly shown and described hereinabove. Rather, the scope of the present invention is defined by the claims which follow.

What is claimed is:

1. A method for performing motion-compensated spectral-spatial selective magnetic resonance imaging (MRI), the method comprising the steps of:

applying a radio frequency (RF) spectral-spatial excitation sequence to a region of a body, said excitation sequence comprising a binomial slice-selective pulse train, said binomial pulse train being comprised of at least two sub-pulses, said binomial pulse train also providing spectrally selective excitation of a selected resonance frequency at a predetermined field strength;

applying to said region an oscillating slice selection gradient so that each sub-pulse of said binomial pulse train is applied during portions of said oscillating gradient having the same polarity, said oscillating gradient further comprising at least one extra gradient switch added to the end of said oscillating gradient for providing inherently motion compensated slice selection;

for providing an improved dynamic range of said MRI imaging.

2. The method of claim 1 wherein said selected resonance frequency is the water resonance frequency for said predetermined field strength for reducing artifacts due to fat resonance frequency excitation and providing substantially fat free images.

3. The method of claim 1 wherein said binomial pulse train of said excitation sequence is phase modulated in order to shorten the duration of the slice selection process and minimize the TE duration.

4. The method of claim 1 wherein said binomial pulse train is a 1-2-1 binomial pulse train.

5. The method of claim 1 wherein said binomial pulse train is a 1-3-3-1 binomial pulse train.

6. The method of claim 1 wherein each sub-pulse of said excitation sequence has an envelope which is modified to correct for the effect of the time varying of the waveform of said oscillating slice selection gradient, for maintaining the fidelity of said slice excitation profile.

7. The method of claim 1 wherein said spectrally selective excitation at a selected resonance frequency is produced by selecting the spacing interval between said sub-pulses of said binomial pulse train in accordance with said predetermined field strength.

8. The method of claim 1 wherein each sub-pulse of said binomial pulse train is applied during portions of said oscillating gradient having identical gradients.

9. The method of claim 8 wherein each sub-pulse of said binomial pulse train is applied during positive gradient portions of said oscillating gradient.

10. The method of claim 1 wherein said selected resonance frequency is the water resonance frequency at said predetermined field strength.

11. A method for performing motion-compensated spectral-spatial selective magnetic resonance angiography, the method comprising the steps of:

applying a radio frequency (RF) spectral-spatial excitation sequence to a region of a body, said excitation sequence comprising a binomial pulse train, said binomial pulse train being comprised of at least two sub-pulses, each of said sub-pulses of said binomial pulse train having an envelope optimized for providing slice-variable tip angle producing a spatially varying slice-excitation-profile for a predetermined range of blood flow velocities and slab widths and a predetermined magnetic field strength, said binomial pulse train also providing spectrally selective excitation of a selected resonance frequency at said predetermined field strength;

applying to said region an oscillating slice selection gradient so that each sub-pulse of said binomial pulse train is applied during portions of said oscillating gradient having the same polarity, said oscillating gradient further comprising at least one extra gradient switch added to the end of said oscillating gradient for providing inherently flow compensated slice selection, for providing an improved dynamic range of said MR angiography and improved small vessel visualization.

12. The method of claim 11 wherein said spatially varying slice excitation profile is a non-linearly increasing slice excitation profile.

13. The method of claim 11 wherein said selected resonance frequency is the water resonance frequency for said predetermined magnetic field strength for reducing artifacts due to excitation of the fat resonance frequency and providing substantially fat free images.

14. The method of claim 11 wherein said binomial pulse train of said RF excitation sequence is phase modulated in order to shorten the duration of the slice selection process and minimize the TE duration.

15. The method of claim 11 wherein said binomial pulse train is a 1-2-1 binomial pulse train.

16. The method of claim 11 wherein said binomial pulse train is a 1-3-3-1 binomial pulse train.

17. The method of claim 11 wherein the envelope of each sub-pulse of said RF excitation sequence is modified to correct for the effect of the time varying of the waveform of said oscillating slice selection gradient, for maintaining the fidelity of said slice excitation profile.

18. The method of claim 11 wherein said spectrally selective excitation at a selected resonance frequency is produced by selecting the spacing interval between said sub-pulses of said binomial pulse train in accordance with said predetermined magnetic field strength.

19. The method of claim 11 wherein each sub-pulse of said binomial pulse train is applied during portions of said oscillating gradient having identical polarity gradients.

20. The method of claim 19 wherein each individual pulse of said binomial pulse train is applied during positive gradient portions of said oscillating gradient.

21. The method of claim 11 wherein said selected resonance frequency is the water resonance frequency at said predetermined magnetic field strength.

* * * * *